(12) United States Patent
Hamilton et al.

(10) Patent No.: US 7,114,556 B2
(45) Date of Patent: Oct. 3, 2006

(54) BURN-IN OVEN HEAT EXCHANGER HAVING IMPROVED THERMAL CONDUCTION

(75) Inventors: Harold E. Hamilton, Minneapolis, MN (US); Tom A. Tremmel, New Brighton, MN (US)

(73) Assignee: Micro Control Company, Coon Rapids, MN (US)

( * ) Notice: Subject to any disclaimer, the term of this patent is extended or adjusted under 35 U.S.C. 154(b) by 294 days.

(21) Appl. No.: 10/322,001

(22) Filed: Dec. 17, 2002

(65) Prior Publication Data

US 2004/0112581 A1    Jun. 17, 2004

(51) Int. Cl.
*F24F 11/06* (2006.01)
*G01R 31/02* (2006.01)

(52) U.S. Cl. .............. 165/247; 165/80.4; 438/14; 324/760; 324/765

(58) Field of Classification Search .......... 165/247, 165/104.33, 80.2, 80.4; 438/14; 257/E23.08; 324/760, 765
See application file for complete search history.

(56) References Cited

U.S. PATENT DOCUMENTS

| | | | |
|---|---|---|---|
| 2,484,585 A | 10/1949 | Quinn | 201/63 |
| 3,979,671 A * | 9/1976 | Meeker et al. | 324/760 |
| 4,381,032 A | 4/1983 | Cutchaw | 165/46 |
| 4,626,643 A | 12/1986 | Minet | 329/10.55 |
| 4,791,364 A | 12/1988 | Kufis et al. | 324/760 |
| 4,900,948 A | 2/1990 | Hamilton | 307/149 |
| 4,969,511 A | 11/1990 | Person | 165/80.4 |
| 4,982,153 A | 1/1991 | Collins et al. | 324/760 |
| 5,001,423 A | 3/1991 | Abrami et al. | 324/760 |
| 5,086,269 A | 2/1992 | Nobi | 324/760 |
| 5,151,574 A | 9/1992 | Urban | 219/241 |
| 5,164,661 A | 11/1992 | Jones | 324/158 |

(Continued)

FOREIGN PATENT DOCUMENTS

JP          6-101-947          4/1994

OTHER PUBLICATIONS

Japanese-to English translation of te claims and the detailed description of JP 06-101947, Feb. 21, 2006.*

(Continued)

*Primary Examiner*—Ljiljana Ciric
(74) *Attorney, Agent, or Firm*—Westman, Champlin & Kelly (57) ABSTRACT

A heat exchange system that can accommodate a high power integrated circuit chip for burn-in temperature stressing includes a heat sink having a chip engaging surface that is adapted to engage a surface of the chip. A liquid layer fills a heat exchange gap between the surface of the chip and the chip engaging surface of the heat sink. The liquid layer provides a low thermal resistance juncture between the chip engaging surface of the heat sink and the surface of the chip, which allows for greater heat transfer therebetween.

29 Claims, 12 Drawing Sheets

U.S. PATENT DOCUMENTS

| | | | | |
|---|---|---|---|---|
| H001145 H | * | 3/1993 | Anderson | 165/80.4 |
| 5,198,752 A | | 3/1993 | Miyata et al. | 324/760 |
| 5,198,753 A | | 3/1993 | Hamburgen | 324/754 |
| 5,414,370 A | | 5/1995 | Hashinaga et al. | 324/760 |
| 5,449,234 A | | 9/1995 | Gipp et al. | 374/185 |
| 5,582,235 A | | 12/1996 | Hamilton et al. | 165/263 |
| 5,722,772 A | | 3/1998 | Keil et al. | 374/45 |
| 5,911,897 A | | 6/1999 | Hamilton | 219/497 |
| 5,918,665 A | | 7/1999 | Babcock et al. | 165/104.33 |
| 5,977,785 A | | 11/1999 | Burward-Hoy | 324/760 |
| 6,184,504 B1 | * | 2/2001 | Cardella | 438/715 |
| 6,259,264 B1 | * | 7/2001 | Freund et al. | 324/760 |
| 6,288,371 B1 | | 9/2001 | Hamilton et al. | 219/530 |
| 6,496,118 B1 | | 12/2002 | Smith | 340/584 |
| 6,636,062 B1 | * | 10/2003 | Gaasch et al. | 324/760 |

OTHER PUBLICATIONS

"Thermal Control Hardware for Accelerated Run-In Testing of Multi-Chip Modules", IBM Tech. Disclosure Bulletin, vol. 32, No. 5A, pp. 129-130, Oct. 1989.

Office Communication for Application No. 10/669,736 filed Sep. 24, 2003, date of mailing Oct. 14, 2005.

* cited by examiner

BURN-IN OVEN HEAT EXCHANGER HAVING IMPROVED THERMAL CONDUCTION

FIELD OF THE INVENTION

The present invention relates generally to devices for controlling or conditioning the temperature of electronic components which are being temperature stressed in "burn-in" ovens, or the like, to determine characteristics of the electronic components. More particularly, the present invention relates to an apparatus and method that introduces a liquid layer between contacting surfaces of a heat sink and the chip being temperature stressed to increase the thermal conductivity there between and improve control of the temperature of the chip.

FIELD OF THE INVENTION

Electronic components, such as silicon integrated circuit chips or other semiconductor devices, are subject to early failure during their life cycle. Thus, producers of these electronic components have found it cost-effective to rigorously temperature stress electronic components prior to their inclusion in electronic products. By conducting such temperature stressing, and by the elimination of under-performing electronic components that fail during the temperature stressing, the reliability of the electronic components that make it to market by passing the temperature stressing is greatly enhanced.

During such "burn-in" temperature stressing, burn-in boards are used to support a number of electronic components inside a burn-in oven. Burn-in ovens are typically large enough to hold several racks of burn-in boards with each burn-in board holding several integrated circuit chips. The chips are powered and exposed to heat stress over an extended period of time. During burn-in temperature stressing of the chips, heat exchange systems are employed to maintain the chips within a desired temperature range to prevent overheating of the chips, which can damage properly functioning chips.

One such heat exchange system, described in U.S. Pat. No. 6,288,371 (Hamilton et al.) and assigned to the Assignee of the present invention, utilizes a heat sink that contacts the chip being temperature stressed. A helium layer is provided between the heat sink and the chip to decrease thermal resistance and increase thermal conductivity there between. Thus, the heat exchange system of Hamilton et al. is more effective at maintaining the desired chip temperature than would be possible without the helium layer since the heat generated by the chip can be exchanged with the heat exchange system at a higher rate.

Integrated circuit chips are continuously being improved to meet the never-ending demands for higher performance. Today's high performance chips demand a large amount of power. Proper burn-in temperature stressing of these chips requires applying more power to the chips for the stressing period. As a result, the chips produce more heat, which must be rapidly dissipated to maintain the chips within the desired temperature range.

There is a continuing need to develop improved heat exchange systems to accommodate current and future high power integrated circuit chips for burn-in temperature stressing.

SUMMARY OF THE INVENTION

The present invention is directed to a heat exchange system that can accommodate a high power integrated circuit chip for burn-in temperature stressing. The heat exchange system includes a heat sink having a chip engaging surface that is adapted to engage a surface of the chip being stressed. A liquid layer fills a heat exchange gap between the surface of the chip and the chip engaging surface of the heat sink. The liquid layer provides a low thermal resistance juncture between the chip engaging surface of the heat sink and the surface of the chip, which allows for greater heat transfer therebetween for greater control of the chip temperature, as compared to prior art heat exchange systems.

DETAILED DESCRIPTION OF THE PREFERRED EMBODIMENTS

Figure 1:
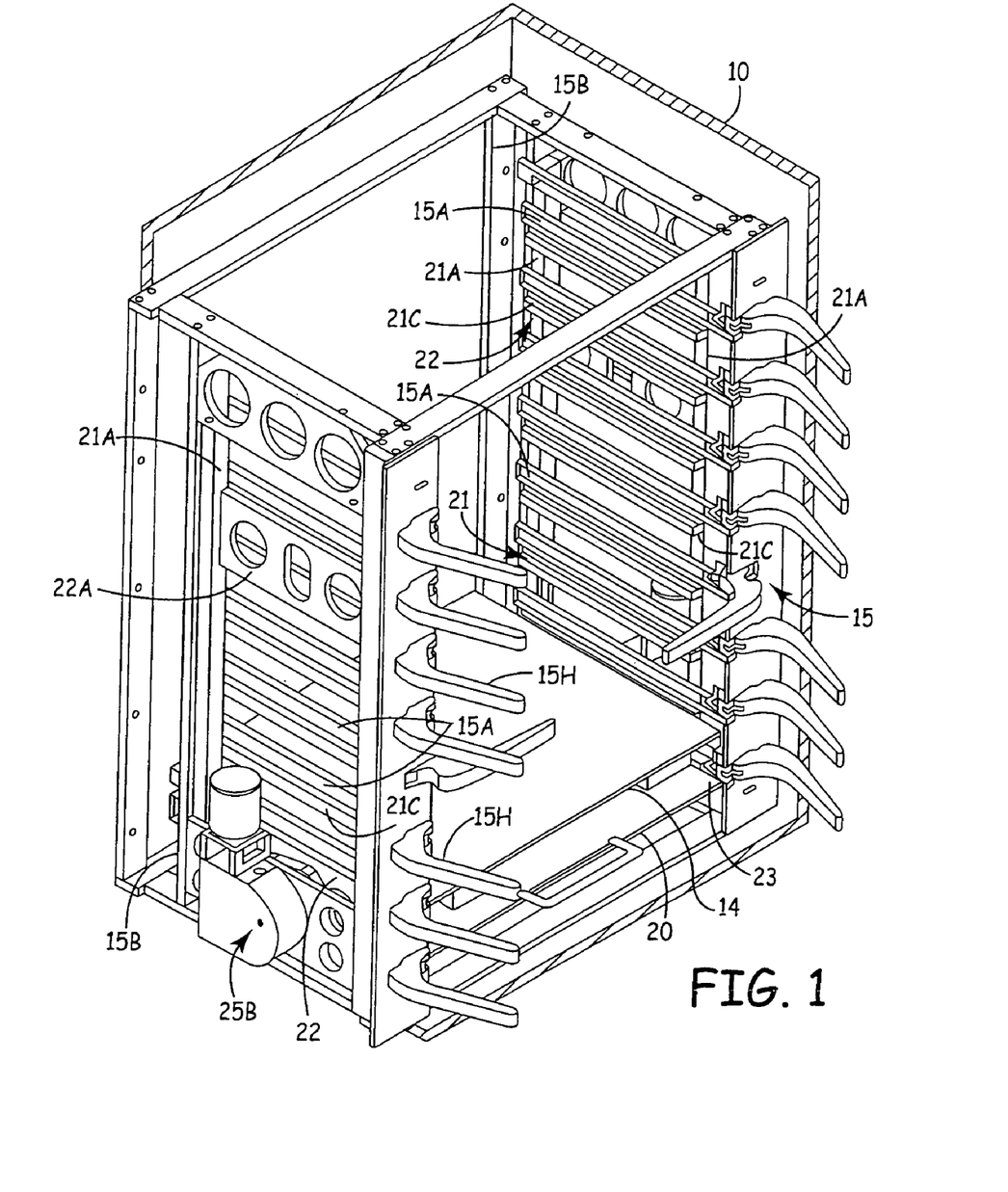
FIG. 1 is a schematic perspective view of a burn-in oven having a rack supporting heat exchange systems made in accordance with the present invention above burn-in boards.

A burn-in oven that is shown only fragmentarily in FIG. 1 at 10 is used to perform burn-in temperature stressing of integrated circuit chips 12 on burn-in boards 14. A rack 15 supports the boards 14 in the oven on tracks 15A. The burn-in boards 14 generally, in the form shown, mount several (typically four or more) chips 12 having circuits, and each of these chips 12 is mounted in a chip mount 13 along the plane of the burn-in board 14. The circuits on the chips 12 are connected with suitable connectors to external control circuitry 12A (FIG. 2) for operating the circuits and carrying out conventional burn-in temperature stressing of the chips 12. The chips 12 have upper plane surfaces 16 that are to be contacted with a heat exchange system of the present invention for removing excess heat generated in response to the power consumption of the circuits to maintain the chips 12 within a desired temperature range during burn-in temperature stressing.

Figure 2:
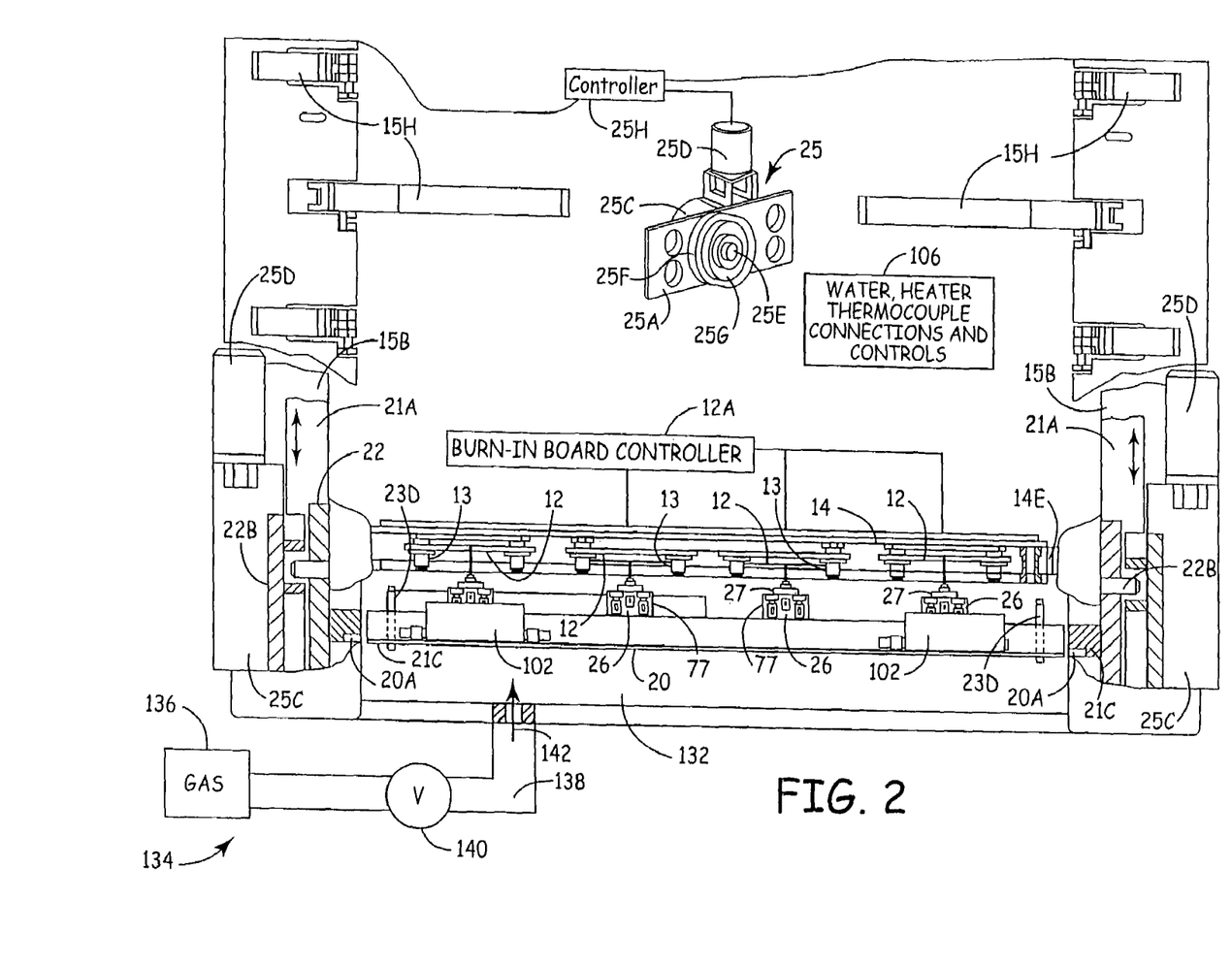
FIG. 2 is a fragmentary schematic front view of a rack supporting a thermal board having heat exchange systems made in accordance with the present invention installed thereon, shown underlying a burn-in board supporting integrated circuit chips that are associated with the heat exchange systems with an inset perspective view of a cam drive used for moving thermal boards into contact with an associated burn-in board.
Figure 3:
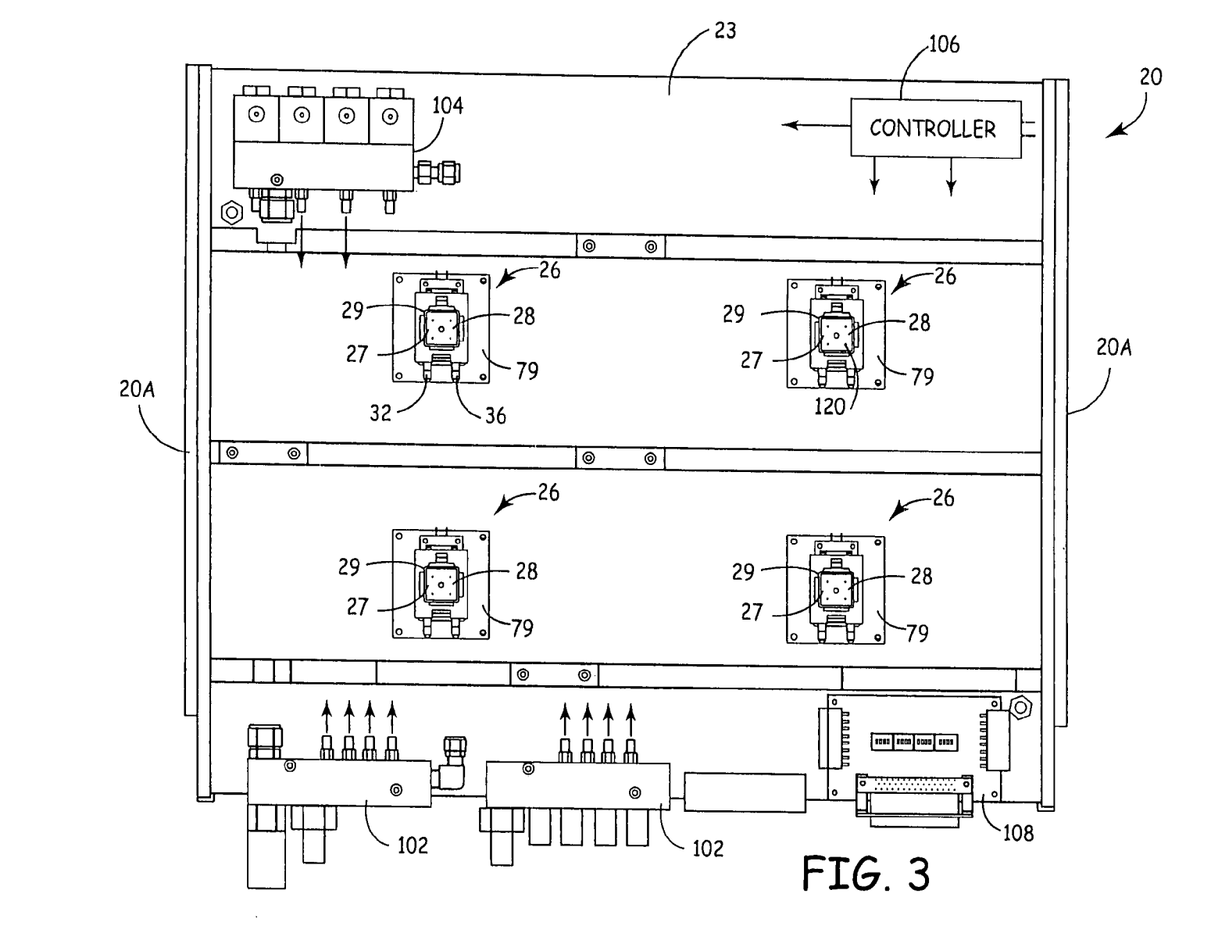
FIG. 3 is a top plan view of a typical thermal board having heat exchange systems and mounting made according to the present invention.

A thermal board assembly shown at 20 in FIGS. 1, 2 and 3, is mounted on movable frames 21 on each side of the rack 15 that slide vertically, and include uprights 21A that are slideably mounted relative to fixed frame uprights 15B on which burn-in board tracks 15A are supported. As shown in FIG. 1, the rack 15 includes eight burn-in boards 14 and eight thermal boards 20, however the rack 15 can be configured to handle more or fewer burn-in and thermal boards. The slidable frames 21 are provided on each side of the rack 15. Thermal board support tracks 21C are mounted on the vertically movable uprights 21A and have grooves 21D to receive flanges 20E on the thermal boards (see FIG. 2). The frames 21 are vertically slidable to move thermal board assemblies 20 toward and away from the chips 12 on the overlying burn-in board 14. The side flanges 20A on the thermal boards 20 slide into the grooves 21D on the tracks 21C. The thermal board assemblies are supported parallel to the respective burn-in board 14. The movement of the thermal board assemblies 20 can be accomplished in any desired manner, so the structure for supporting and moving it is shown only schematically.

The movable frames 21, in addition to the tracks 15A, that are bolted to and hold the vertical uprights 21A together and lower and upper cross plates 22 and 22A also join the uprights 21A (see FIGS. 1 and 2). The lower cross plate 22 on each movable frame 21 has a cam follower pin 22B mounted thereon and protruding out to the side. The cam follower pin serves as a drive for vertically reciprocating the frame 21. A cam and drive assembly 25B is mounted onto a fixed cross plate 25A mounted to the uprights 15B of the rack supporting the burn-in boards and thermal boards. The cam and drive assembly 25B includes a gear box 25C that is driven from a motor 25D (see also FIG. 2) that includes an output shaft 25E that extends through the fixed plate 25A and has a spiral cam member 25F mounted on the shaft. Motors 25D are stepper motors, which are synchronized and operated by a controller 25H shown schematically in FIG. 2. The spiral cam member will rotate when the motor is running, and has a spiral groove 25G that receives the cam follower pin 22B so that when the cam motor 25D is driven and the gear box 25C drives the spiral cam 25C, the pin 22B, which is in the groove 25G, will be moved relative to the central axis of the shaft 25E. The movement of the pin 22B will reciprocate the frames 21 so that the movement of the thermal board assemblies 20 is accomplished to move the thermal boards toward or away from the burn-in boards, as shown in FIG. 2. There are guide pins 23D on the thermal board assembles that mate with guide tubes 14E on the burn-in boards for alignment. Also, extractor handles 15H are shown. These are used for extracting the burn-in boards.

The thermal board assemblies 20 include metal heat conductive plates 23, on which heat exchange systems 26 of the present invention are mounted, as shown in FIGS. 2 and 3. Each chip 12 has a corresponding heat exchange system 26, with which it is aligned. Each heat exchange system 26 includes a central heat sink block 29 that has an end boss 27 having a chip engaging surface 28 that will contact a surface 16 of one of the chips 12 that is being temperature stressed on the burn-in board 14.

Figure 10:
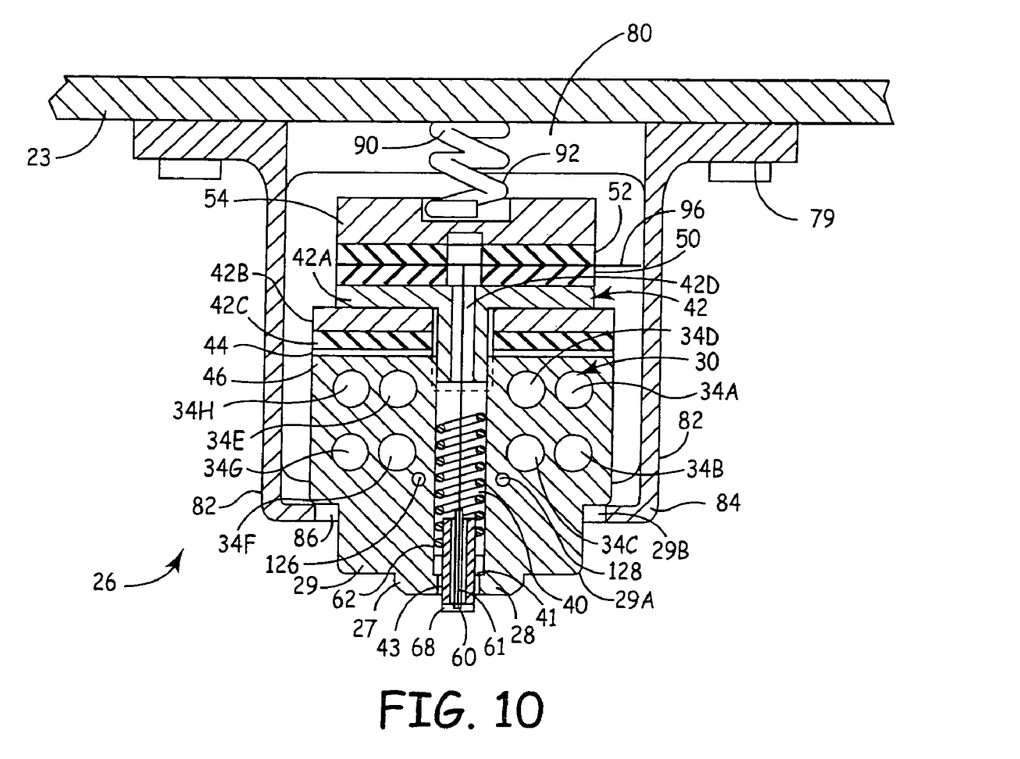
FIG. 10 is a sectional view taken on line 10—10 of FIG. 5.

FIG. 10 and other cross-sectional views of heat exchange system 26 show the central block or heat sink 29. As shown, the block 29 has a plurality of longitudinal passageways 30 bored therethrough, with end cross passages that connect the passageways so that water from a water input connector and line 32, shown in FIGS. 3–7, will enter a first passageway 34A, and the water then will be circulated through additional passageways 34B, 34C, 34D, 34E, 34F, 34G and 34H in sequence. The waste water or water that has been used for cooling, comes through the last passageway 34H and is discharged through a connector and line 36 and sent to a drain. FIG. 7 shows a connecting passageway 35A that connects passageways 34D and 34E and FIG. 10 shows a passageway 35B connects passageways 34F and a passageway 35C that connects passageway 34G and 34H. The connecting passageways are made in the ends of the block. End caps are made in a conventional manner and are soldered or otherwise sealed on the ends of block 29 to enclose the passageways cut therein. The end caps are soldered in place so the central block becomes unitary as is generally shown in the cross-sectional views of FIGS. 7, 8 and 10.

The heat sink block 29 has a central passageway 40 that is bored into the block 29 at the boss 27. A shoulder 31 surrounds an opening 43 in boss 27. The passageway 40 has an axis that is at right angles to the plane of the block and plate 23 and at right angles to the axes of passageways 30. The through passageway 40 extends upwardly, and a cap 42 has a threaded neck that threads into the end of passageway 40 and seals it. The cap 42 also has a flange 42A that bears upon a cover plate 42B that covers a layer of insulation 42C that, in turn, overlies a heater 44 sandwiched between the insulation layer 42B and an upper surface 46 of the central block 29. The neck of cap 42 has a passageway 42D that aligns with passageway 40 and is of smaller diameter. The threads on the neck of the cap seal the passageway 40 along its edge and the heater 44 and insulation layer 42C form a gas and liquid tight seal.

There are two stacked gaskets 50 and 52 on top of the flanges 42A. A clamp plate 54 is used for holding the cover plate in position on top of the cap 42. The gaskets 50 and 52 have central holes aligning with passageway 42D and clamp plate 54 closes off the holes the passageway 42D. The clamp plate 54 is held with screws 55 threaded into flange 42A.

A chip temperature sensor 60 is mounted in the end of the bore or passageway 40. Sensor 60 is preferably a thermocouple and is mounted in a cylindrical, tube carrier 61 that has an annular flange 62 around the carrier that slides in the bore 40, as shown in FIG. 7. The bore 40 has a shoulder 41 at the lower end for retaining the flange 62 in the bore 40. The tube 61 carrying the sensor 60 has an end portion 68 that extends out opening 43. The flange 62 slides in the larger part of the bore 40. There is a small space or clearance between the periphery of the bore 40 and the flange 62 and also between end cylindrical portion 68 and the surface defining opening 43.

A low force coil spring 66 is mounted in bore 40 and bears against the flange 62 and is held in the bore by cap 42. The spring 66 wages the tube carrier 61 and thus sensor 60 outwardly so flanges 62 contact shoulder 41. The cross-sectional view of FIG. 7, shows the carrier 61 retracted slightly. It can be seen in FIG. 11 that the low force spring 66 will hold sensor 60 in engagement with the chip surface 16 under spring load, but the spring 66 will yield to permit the chip and the sensor 60 at the end of tube section 68 to be in intimate contact when chip engaging surface 28 contacts the surface 16 of the chip 12.

Figure 12:
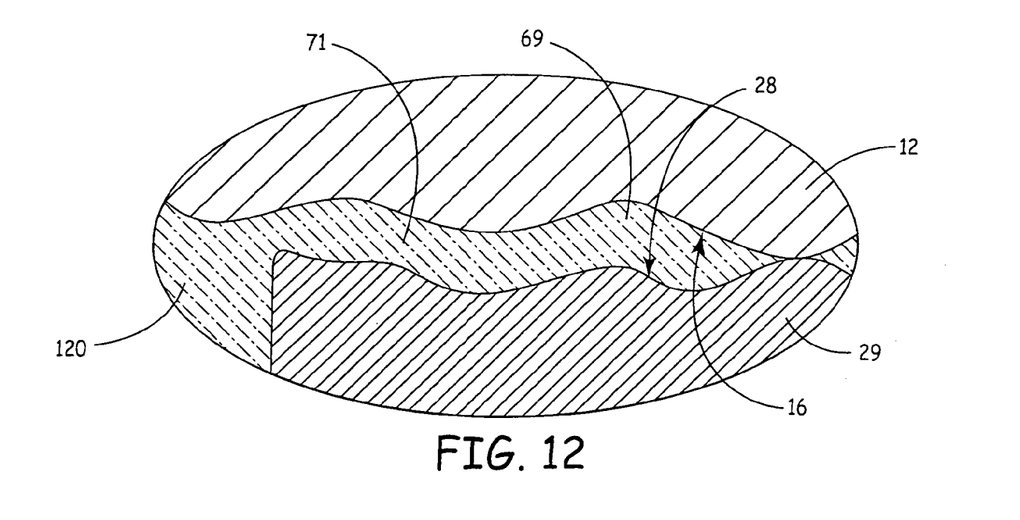
FIG. 12 is a magnified sectional view illustrating a heat exchange gap between a chip engaging surface of a heat sink of the heat exchange system of the present invention and a surface of an integrated circuit chip.

Even though good contact is established between chip engaging surface 28 and surface 16 of chip 12, the thermal resistance between heat sink 29 and chip 12 limits the rate of heat transfer between heat sink 29 and chip 12, which, in turn, limits the amount of power that can be applied to the chip during burn-in temperature stressing. The primary reason for the high thermal resistance is due to incongruities between the chip engaging surface 28 of heat sink 29 and the surface 16 of chip 12, that results in the formation of a heat exchange gap 69 between non-contacting portions of the surfaces 16 and 28, as shown in FIG. 12. When the heat exchange gap 69 is filled with air, the thermal resistance between chip engaging surface 28 and chip surface 16 is increased due to the low thermal conductivity of air.

The present invention decreases the thermal resistance between heat sink 29 and the chip 12 through introduction of a liquid layer 71, as shown in FIG. 12. Liquid layer 71 is preferably formed of distilled water, but other suitable liquids can be used. Liquid layer 71 has a high thermal conductivity relative to air, or even helium, resulting in a significant reduction to the thermal resistance between heat sink 29 and chip 12. Estimates indicate that the thermal resistance between a heat sink 29 with an eighteen by eighteen millimeter chip engaging surface 28 and a chip 12, can drop from approximately 0.3° C./Watt when helium fills the heat exchange gap 69, to approximately 0.06° C./Watt when the liquid layer 71 formed by distilled water is used to fill the heat exchange gap 69. This configuration allows for the temperature stressing of high performance chips through application of high power (e.g., 625 watts) while maintaining the temperature of the chips within the desired stressing range (e.g., typically 120–140° C.).

Liquid layer 71 can be formed of a small volume of liquid, (such as 0.05 cubic centimeters) in order to fill the heat exchange gap 69 that is formed between the non-contacting surfaces of heat sink 29 and the chip 12 being temperature stressed. Liquid layer 71 can be formed as a fixed volume of liquid, or can be formed by a liquid flow that is injected into heat exchange gap 69. Liquid layer 71 can be formed of a cooled liquid to provide further cooling of an integrated circuit chip 12 under stress. The flow rate of the liquid flow can be adjusted to provide additional heat transfer from the chip 12 being temperature stressed.

Figure 4:
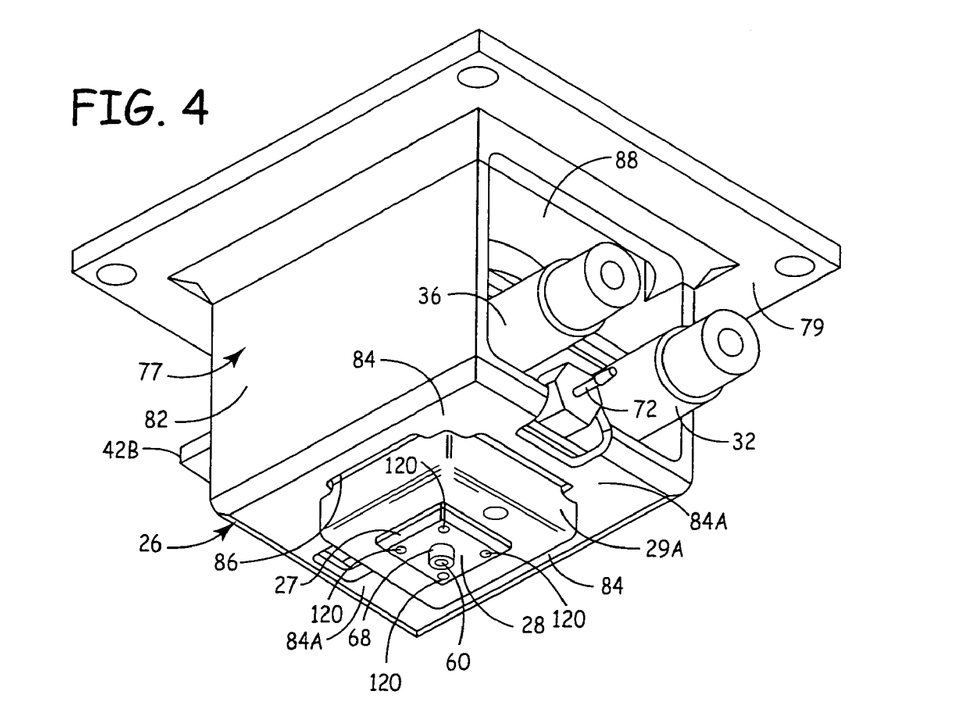
FIG. 4 is a bottom perspective view of a heat exchange system and support cup in accordance with the present invention.
Figure 5:
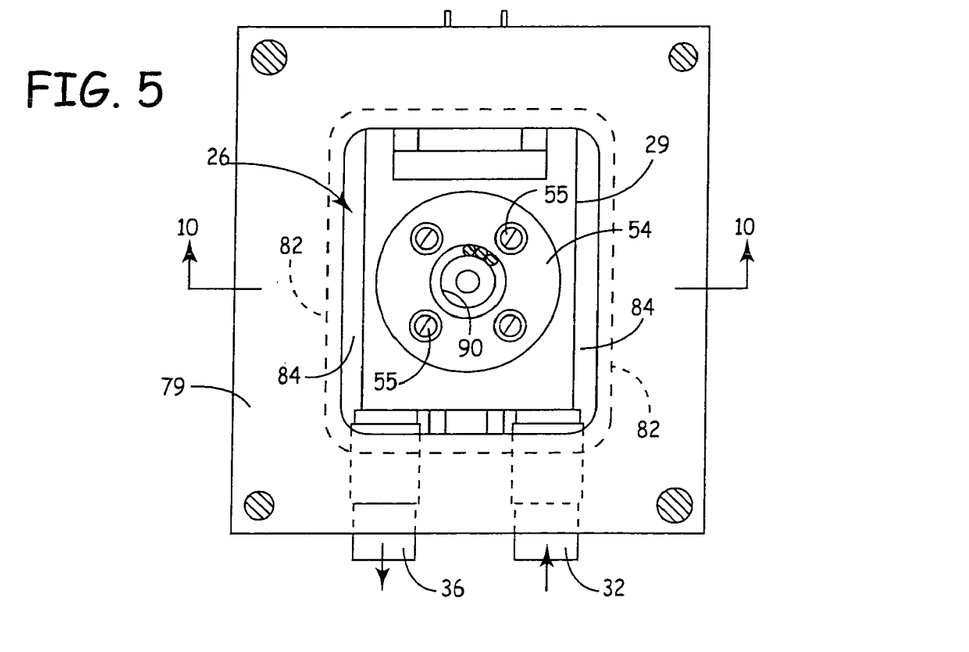
FIG. 5 is a top plan view of the heat exchange system and cup of FIG. 4.
Figure 6:
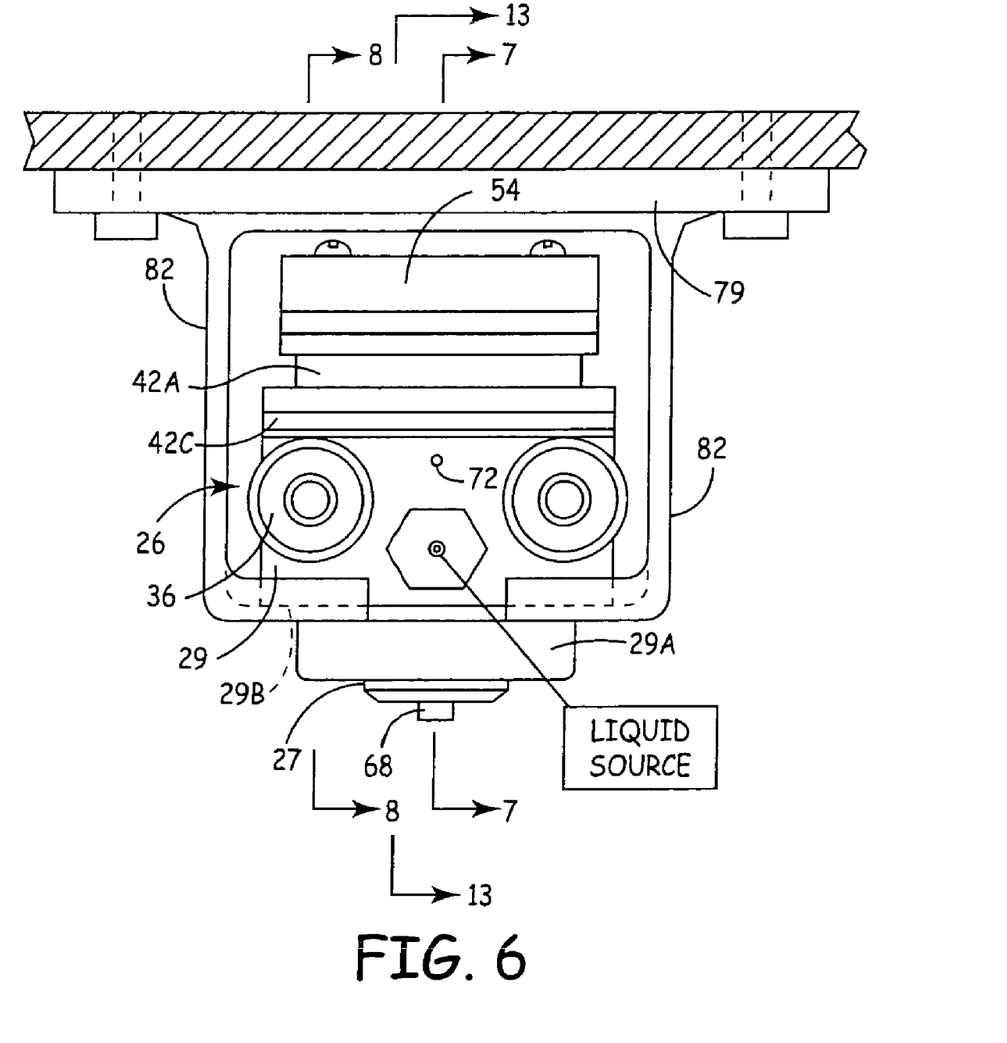
FIG. 6 is an end view of the heat exchange system and cup of FIG. 5.
Figure 7:
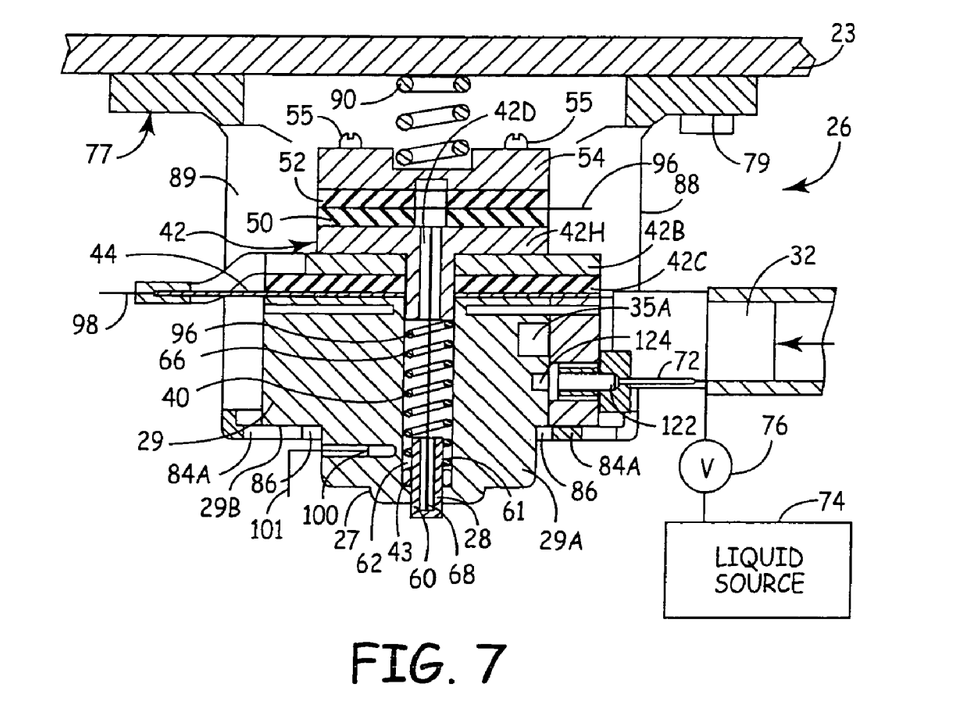
FIG. 7 is a sectional view taken on line 7—7 in FIG. 6.
Figure 13:
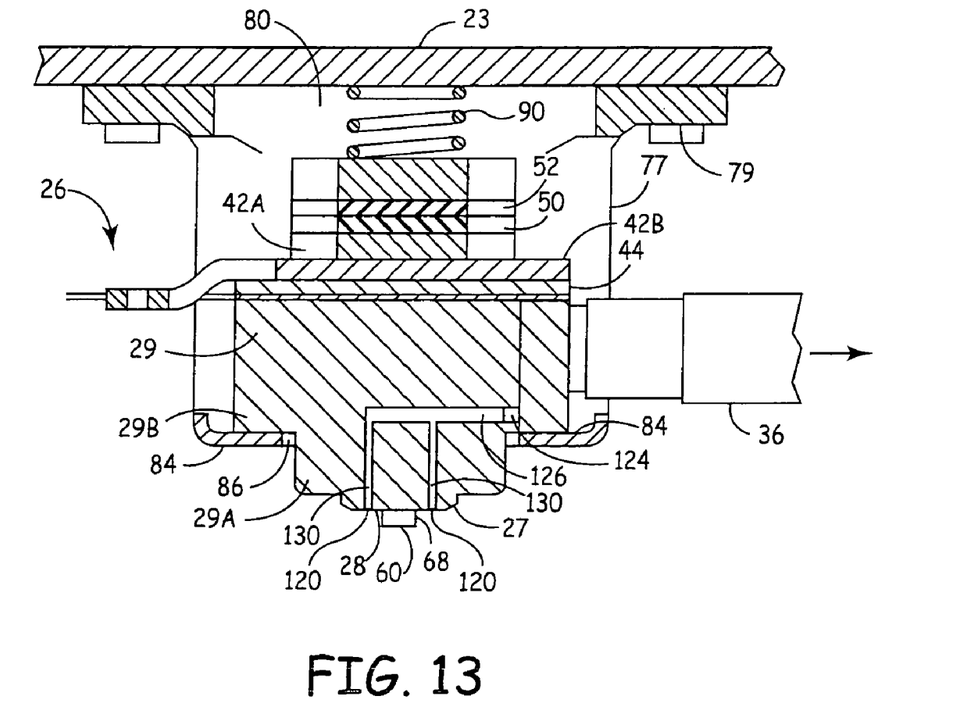
FIG. 13 is a sectional view taken on line 13—13 of FIG. 6.

In accordance with one embodiment of the invention, heat exchange system 26 includes a liquid source 74 that is fluidically coupled to the heat exchange gap 69 to provide the liquid layer 71, as shown in FIGS. 6 and 7. In accordance with one embodiment, the liquid source 74 is coupled to at least one inlet port 120, which is in fluid communication with the heat exchange gap. In accordance with one embodiment, the inlet ports 120 are formed in heat sink 29 and open to the heat exchange gap 69 through chip engaging surface 28, as illustrated in FIGS. 4, 12 and 13. As shown in FIG. 7, it can be seen that an input line and connector 122 is connected to a hose barb 72 that in turn is connected to liquid source 74 through a valve 76. Valve 76 is preferably a solenoid valve that can be manually operated, operated by a controller, or operated in some other desired manner. Input line 122 is connected to a connecting passageway 124 that in turn is connected to a horizontal passageways 126 and 128 that are fluidically coupled to inlets 120 through vertical passageways 130, as shown in FIGS. 7, 10 and 13. Additional inlets 120 can be provided as desired.

During burn-in temperature stressing, the liquid layer may runoff, evaporate, or be converted into steam. The liquid layer in the heat exchange gap can be replenished by the liquid flow from liquid source 74. In accordance with one embodiment of the invention, burn-in oven 10 can purge the moist air in the burn-in chamber 132, in which the thermal and burn-in boards are mounted, with air purging system 134, shown in FIG. 1. Air purging system 134 includes a source of compressed gas 136, that is fluidically coupled to the burn-in chamber 132 by an air duct 138. A valve 140 is positioned in line with the air duct 138 and is configured to control an airflow (indicated by arrow 142) from the source of compressed gas 136 into the burn-in chamber 132. Source of compressed gas 136 includes compressed dry air, nitrogen, or other gas, which replaces the moist air within chamber 132 as airflow 142 is introduced therein. In addition to exhausting the moist air in the burn-in chamber 132, the air purging system 134 can provide additional cooling of the burn-in boards. A dehumidifier can also be included in the system to remove moisture from the air.

Figure 15:
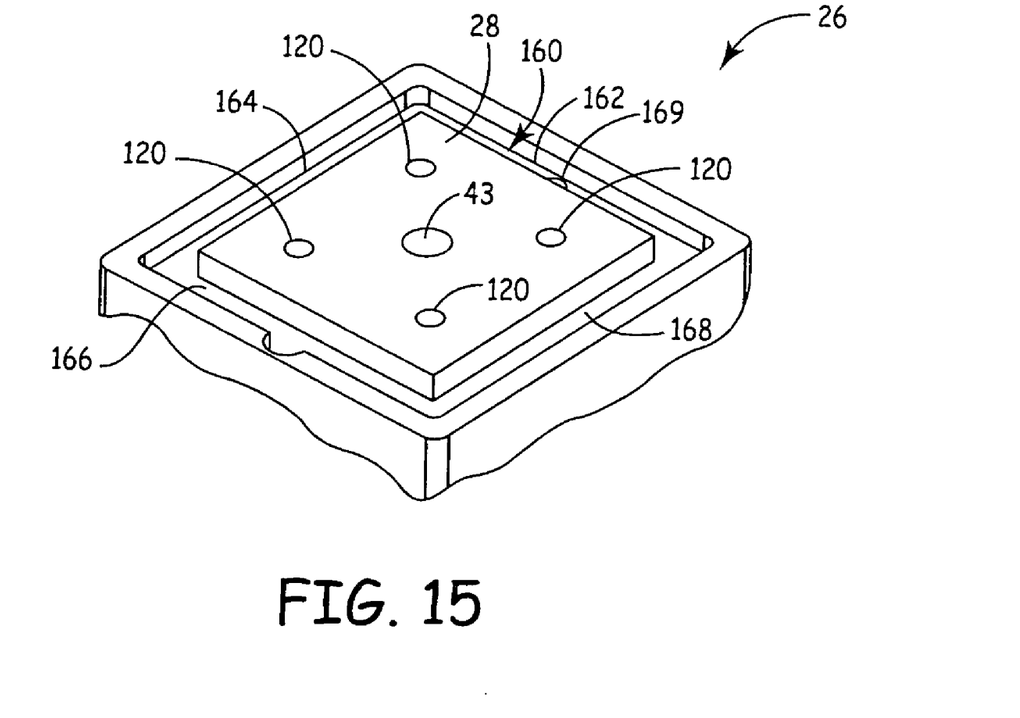
FIG. 15 is a partial top perspective view of a heat sink in accordance with an embodiment of the invention.

Liquid runoff from heat exchange gap 69 can be accommodated by the formation of a moat 160 surrounding chip engaging surface 28 of heat sink 29, as illustrated in FIG. 15. The moat 160 is defined by channel sections 162, 164, 166, and 168 that are formed in heat sink 29 and surround chip engaging surface 28. The moat 160 is sized to contain liquid overflow from the heat exchange gap 69 to prevent liquid from accumulating on the thermal board 20 to which heat sink 29 is mounted or contacting other components there below. One or more drains 169 are formed at the base of one of the channel sections. Drain 169 is preferably fluidically coupled to a vacuum system that sucks the liquid overflow from moat 160 into drain 169. The drained liquid overflow can then be delivered to waste or recovered for reuse.

Figure 8:
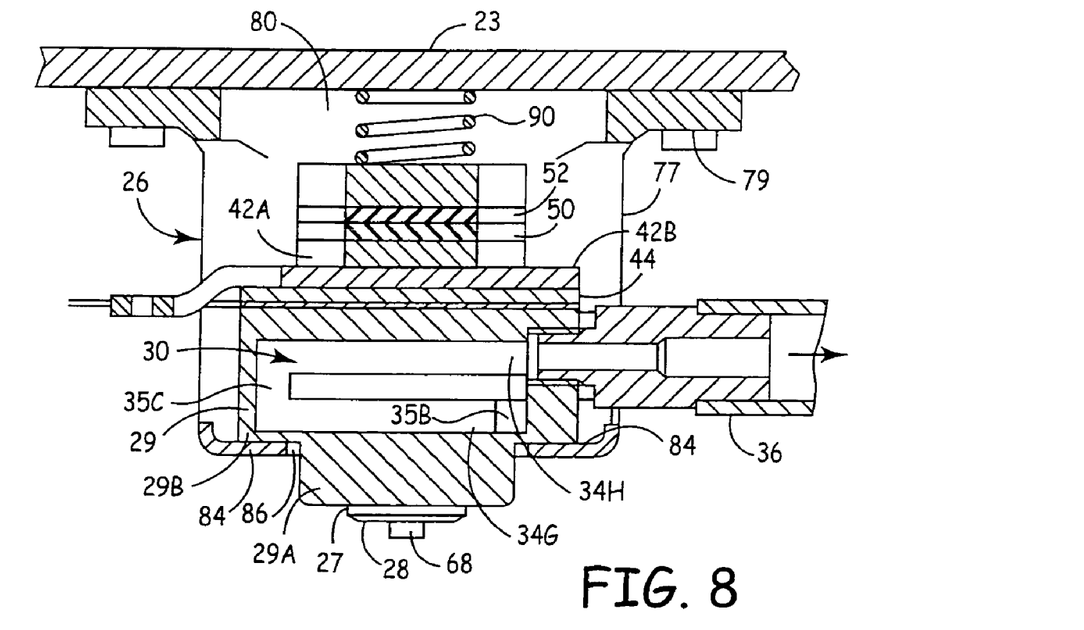
FIG. 8 is a sectional view taken on line 8—8 in FIG. 6.
Figure 9:
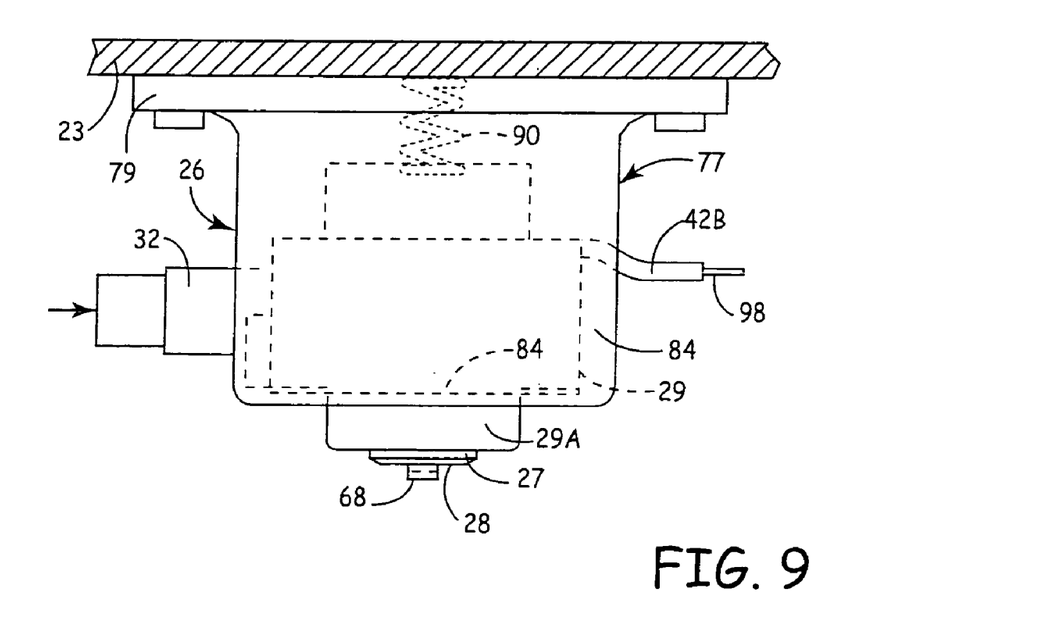
FIG. 9 is a side view of the heat exchange system and cup from a side opposite from that shown in FIG. 4.

The heat exchanger 26 is mounted in an outer cage or housing called a "cup" 77 that has a flange 79 around the periphery thereof that bolts or fastens in a suitable manner with fasteners to the metal thermal plate 23. The cup 77 has an opening 80 at the top and side walls 82 on two spaced sides with inwardly turning flanges 84 at the lower ends. The sides of the cup at right angles to walls 82 form openings 88 and 90, but there are internal flanges 84A, which, together with edges 84, surround a central opening 86 through which the end portion 29A of the thermal block extends with some clearance. The heat sink block 29 has a larger upper portion that forms a shoulder 29B that rests on the flange 84 when the portion 29A extends through the opening 86, as shown in FIGS. 7, 8 and 10. The openings 88 and 90 are at right angles to the main depending walls 82, to permit connections for water, and for the electrical connections to extend to the heat sink block. The portion 29A is encircled by the flanges 84 and 84A and the shoulder 29B is contained and rests thereon.

A resilient member 90, depicted as a compression coil spring, is mounted in a cavity 92 formed in the clamp plate 54. The resilient member 90 bears against the underside of the thermal plate 23, as shown in the cross-sectional views to provide a spring load urging the shoulder 29B down against the flanges or bottom edge walls 84 and 84A.

Figure 11:
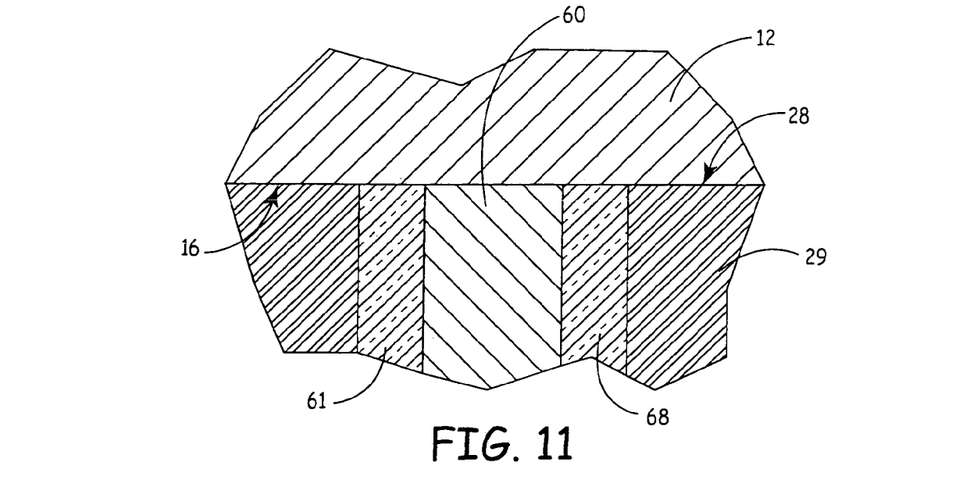
FIG. 11 is a simplified sectional view of a chip engaging surface of a heat sink and a chip temperature sensor of the heat exchange system of the present invention in contact with a surface of an integrated circuit chip.

It should also be noted that the heat sink block 29 is spaced from the side walls 82, and the partial side walls forming the end openings 88 and 90, so that the block 29 can move up to displace the shoulders 29B from the wall flanges 84 and 84A under pressures applied when the thermal plate assembly 20 is moved down against an aligned burn-in board 14. The block 29 can cock slightly because the opening 86 is made slightly larger than the end portion 29A that extends through it. This permits the block 29 to generally align with the surface of the chip that it is moved against, so that the chip engaging surface 28 of the boss 27 of the heat sink will come into as close to continuous contact as possible as shown in FIG. 11. Additionally, the chip temperature sensor 60 will retract, as permitted by the spring 66.

The spring 90 will also retract and yield so that the heat sink 29 can move upwardly and self-aligning because the cup 77 will positively capture the heat sink and yet permit it to retract and move for self-alignment.

Thus, the chip temperature sensor 60 is spring loaded with a light spring, and the entire heat sink block is spring loaded with a second spring 90 of different strength. The structure permits the thermocouple connection wires indicated at 96 to pass upwardly through the bore 40, and through the bore 42D, and through the center opening in the gasket 50, and then laterally out sandwiches between the gaskets 50 and 52, as shown in FIGS. 7 and 10. This eliminates the need for providing a groove or opening for the sensor wires and yet keeps the passageway 40 sealed.

The heater 44 also has wires or leads 98 that pass out along the top plate 42B, and are supported thereby.

The temperature of the heat sink block 29 also is sensed and controlled with a suitable heat sink temperature sensor 100 that is installed in a bore in the block portion 29A as shown in FIG. 7. Suitable leads 101 can be used for sensor 100, which could be a thermocouple or other suitable temperature sensor.

As shown in FIG. 3, manifolds indicated at 102 are provided for the water connections, and are shown schematically, and solenoid valves shown schematically at 104 can be used for providing water to each of the individual heat sinks. A controller 106 shown schematically receives the signals from chip temperature sensor 60 and will provide signals to the individual solenoid valves 104 in a suitable manner to open them if cooling is needed and close them if the chip temperature is in the desired range. Controller 106 also can receive a signal from the heat sink temperature sensor 100 for overall temperature control and will provide output signals to the leads 98 for the heater, when that is needed. Control of the sensors 60 and 100 can be through suitable connectors and circuitry shown schematically on a circuit board 108 in FIG. 3. Other suitable connectors can be used for carrying the power to the solenoids 104, and the overall arrangement can be made so that the controller 106 is not on the thermal board, but is kept separate. By regulating the flow of water using individual solenoid valves for each of the heat sinks that are used with a burn-in board assembly (four in the situation shown) the temperature of the chips can be maintained in a desired stressing range, and again, the introduction of the liquid layer 71 to the heat exchange gap 69 provides good thermal coupling between the heat sink blocks and the associated chip on the burn-in board to accommodate irregularities in the surfaces that mate.

Figure 14:
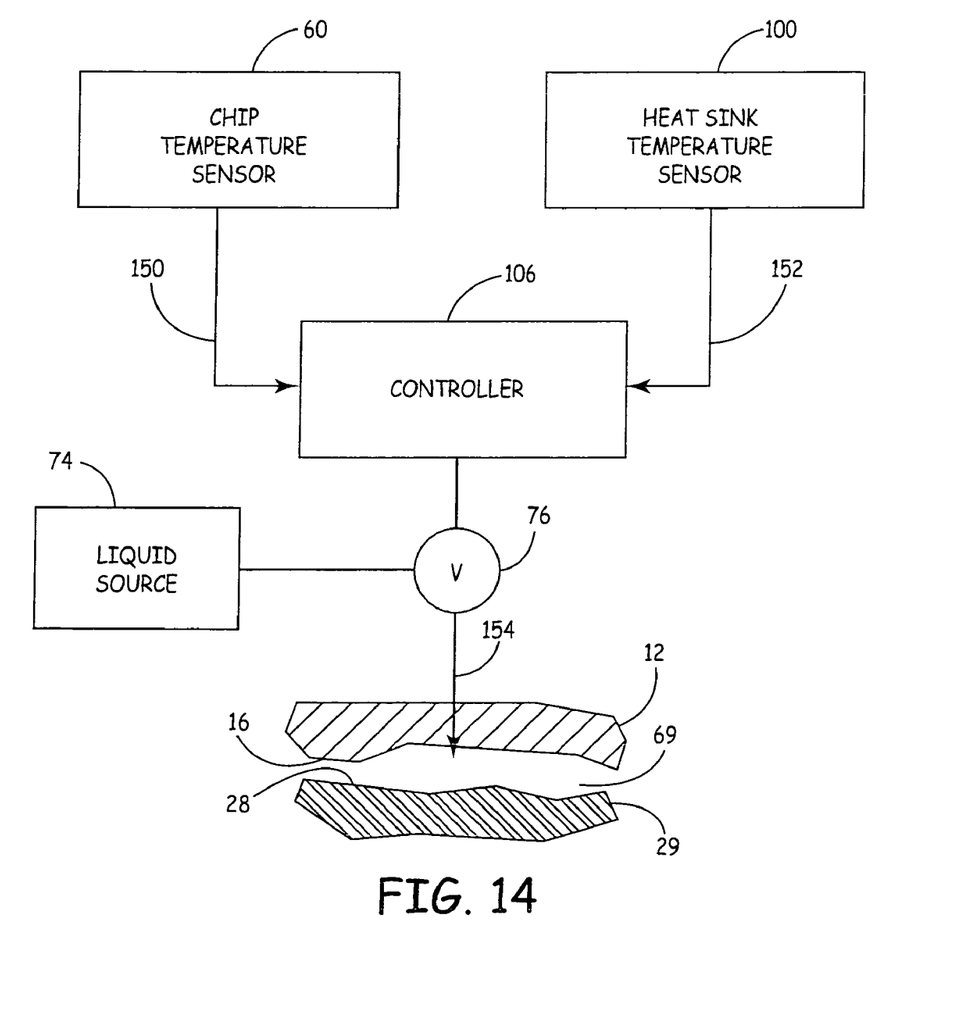
FIG. 14 is a schematic diagram of a control system of a burn-in oven for controlling a heat exchange system that provides a liquid flow to the heat exchange gap illustrated in partial cross-section, in accordance with embodiments of the invention.

FIG. 14 is a schematic diagram of the control system of the heat exchange system 26 that is used to control the liquid flow between liquid source 74 and the heat exchange gap 69. As illustrated, controller 106 can receive a chip temperature output signal (depicted as arrow 150) from chip temperature sensor 60, and a heat sink temperature output signal (depicted as arrow 152) from heat sink temperature sensor 100. The chip temperature output signal 150 is indicative of a temperature of the chip 12 being stressed. The heat sink temperature output signal 152 is indicative of a temperature of the heat sink 29. Controller 106 can control the liquid flow (depicted as arrow 154) traveling to the heat exchange gap 69 in response to the temperature output signals.

In general, the liquid flow 154 can be triggered when the temperature of the chip 12 exceeds a threshold value. Accordingly, burn-in temperature stressing of chip 12 can be conducted without the formation of liquid layer 71 in the heat exchange gap 69 until the temperature of the chip 12, as indicated by chip temperature output signal 150, exceeds the threshold value, at which time controller 106 can open valve 76 to introduce the liquid layer 71 in the heat exchange gap 69 and thereby decrease the thermal resistance between heat sink 29 and chip 12 and increase the thermal transfer therebetween to cool chip 12 below the threshold value.

In accordance with another embodiment of the invention, controller 106 is adapted to calculate a thermal resistance between heat sink 29 and chip 12 using the chip temperature output signal 150 and the heat sink temperature output signal 152 from sensors 60 and 100, respectively. The thermal resistance can be calculated in accordance with the following equation:

$$Q = [T_{chip} - T_{heat\ sink}]/\text{power}$$

where $Q$ is the thermal resistance, $T_{chip}$ is the temperature of the chip being temperature stressed, and $T_{heat\ sink}$ is the temperature of heat sink 29. In accordance with this embodiment, controller 106 introduces the liquid layer 71 in the heat exchange gap 69 when the thermal resistance ($Q$) rises above a threshold value. In the event that the thermal resistance ($Q$) exceeds the threshold value, the introduction of the liquid layer 71 to the heat exchange gap 69 by controller 106 will decrease the thermal resistance between heat sink 29 and the chip 12 being stressed to prevent the overheating of the chip. The threshold value of the thermal resistance ($Q$) can be selected to provide a sufficient safety factor that ensures that the system will not overheat.

The heater 44 can be used where the chip being stressed has circuits that do not consume much power, and the temperature has to be maintained at a particular level requiring the addition of heat. Of course, during that time, the water cooling would not be used, but heat would be added through the thermal block, and the heat conducting layer of liquid can also be provided at that time for conducting heat to a chip.

Although the present invention has been described with reference to preferred embodiments, workers skilled in the art will recognize that changes may be made in form and detail without departing from the spirit and scope of the invention.

What is claimed is:

1. A heat exchange system for controlling the temperature of an integrated circuit chip during burn-in temperature stressing of the chip, the system comprising:
   a chip mount configured to support a chip;
   a liquid source;
   a heat sink having a bore and a surface facing the chip mount and including a port fluidically coupled to the liquid source; and
   a chip temperature sensor mounted in the bore and positioned to engage a chip supported in the chip mount, the chip temperature sensor having a chip temperature output signal that is indicative of a temperature of the chip.

2. The system of claim 1 including a heat exchange gap between the surface of the heat sink facing the chip mount and a chip mounted in the chip mount; wherein the port is in fluid communication with the heat exchange gap.

3. The system of claim 1, wherein the heat sink includes a plurality of passageways.

4. The system of claim 1, including a cup member for supporting the heat sink, the cup member having a wall portion encircling the heat sink and providing an opening through which a boss of the heat sink extends.

5. The system of claim 4, including a resilient member for urging the surface of the heat sink facing the chip mount against a chip supported in the chip mount.

6. The system of claim 1 further comprising:
an element for driving the liquid flow from the liquid source through the port; and
a controller configured to control the flow rate in response to the chip temperature output signal.

7. The system of claim 1 including a resilient member for urging the chip temperature sensor outwardly from the surface of the heat sink facing the chip mount toward the chip mount.

8. The system of claim 1 including:
a heat sink temperature sensor having a heat sink temperature output signal that is indicative of a temperature of the heat sink; and
a liquid controller controlling a liquid flow traveling from the liquid source an through the port in response to the heat sink and chip temperature output signals.

9. The system of claim 8, wherein the
liquid controller controls the liquid flow in response to a thermal resistance between the surface of the heat sink facing the chip mount and a chip mounted in the chip mount using the heat sink and chip temperature output signals.

10. The system of claim 1, wherein the liquid source contains distilled water.

11. The system of claim 1, wherein the heat sink includes a moat surrounding the surface facing the chip mount.

12. The system of claim 1, further comprising:
a burn-in chamber, in which the chip mount is supported; and
an air purging system having a source of compressed gas fluidically coupled to the burn-in chamber by an air duct, and a valve in line with the air duct and configured to control an airflow from the source of compressed gas into the burn-in chamber.

13. A heat exchange system for integrated circuit chip burn-in temperature stressing, the system comprising:
a chip mount configured to support a chip;
a liquid source;
a heat sink having a surface facing the chip mount, the surface facing the chip mount having a plurality of ports each fluidically coupled to the liquid source;
a chip temperature sensor having a chip temperature output signal that is indicative of a temperature of a chip supported in the chip mount; and
a liquid flow controller, controlling a liquid flow traveling from the liquid source through the ports.

14. The system of claim 13, wherein the liquid flow is controlled by the controller based upon the chip temperature output signal.

15. The system of claim 14, wherein:
the heat sink includes a bore; and
the chip temperature sensor is mounted in the bore and positioned to engage a surface of a chip seated in the chip mount.

16. The system of claim 15, including a resilient member urging the chip temperature sensor outwardly from the surface of the heat sink facing the chip mount toward the chip mount.

17. The system of claim 13 including a heat sink temperature sensor having a heat sink temperature output signal that is indicative of a temperature of the heat sink.

18. The system of claim 17, wherein the liquid flow controller controls the liquid flow in response to the chip and heat sink temperature output signals.

19. The system of claim 17, wherein the liquid flow controller controls the liquid flow in response to a thermal resistance between the surface of the heat sink facing the chip mount and a chip supported in the chip mount.

20. The system of claim 13 including a cup member for supporting the heat sink, the cup member having a wall portion encircling the heat sink and providing an opening through which a boss of the heat sink extends.

21. The system of claim 13 including a resilient member for urging the surface of the heat sink toward the chip mount.

22. The system of claim 13, wherein the liquid source comprises distilled water.

23. The system of claim 13, wherein the heat sink includes a moat surrounding the surface.

24. The system of claim 13, further comprising:
a burn-in chamber, in which the chip mount is supported; and
an air purging system having a source of compressed gas fluidically coupled to the burn-in chamber by an air duct, and a valve inline with the air duct and configured to control an airflow from the source of compressed gas into the burn-in chamber.

25. A heat exchange system for controlling the temperature of an integrated circuit chip during burn-in temperature stressing of the chip, the system comprising:
a chip mount configured to support a chip;
a liquid source;
a heat sink having a surface facing the chip mount and including a port fluidically coupled to the liquid source;
a heat sink temperature sensor having a heat sink temperature output signal that is indicative of a temperature of the heat sink;
a chip temperature sensor having a chip temperature output signal that is indicative of a temperature of a chip supported in the chip mount; and
a liquid controller controlling a liquid flow traveling from the liquid source an through the port in response to the heat sink and chip temperature output signals.

26. The system of claim 25, wherein the liquid controller controls the liquid flow in response to a thermal resistance between the surface of the heat sink facing the chip mount and a chip mounted in the chip mount using the heat sink and chip temperature output signals.

27. The system of claim 25 including a heat exchange gap between the surface of the heat sink facing the chip mount and a chip mounted in the chip mount; wherein the port is in fluid communication with the heat exchange gap.

28. The system of claim 25, including a resilient member for urging the surface of the heat sink facing the chip mount against a chip supported in the chip mount.

29. The system of claim 25, wherein:
the heat sink includes a bore; and
the chip temperature sensor is mounted in the bore.

* * * * *

UNITED STATES PATENT AND TRADEMARK OFFICE
CERTIFICATE OF CORRECTION

PATENT NO. : 7,114,556 B2 Page 1 of 1
APPLICATION NO. : 10/322001
DATED : October 3, 2006
INVENTOR(S) : Harold E. Hamilton et al.

It is certified that error appears in the above-identified patent and that said Letters Patent is hereby corrected as shown below:

Col. 9, line 24, change "an" to --and--.

Col. 10, line 43, change "an" to --and--.

Signed and Sealed this

Sixth Day of February, 2007

JON W. DUDAS
*Director of the United States Patent and Trademark Office*